US012720836B2

(12) United States Patent
Xie et al.

(10) Patent No.: US 12,720,836 B2
(45) Date of Patent: Aug. 25, 2026

(54) FORMING NS GATES WITH IMPROVED MECHANICAL STABILITY

(71) Applicant: INTERNATIONAL BUSINESS MACHINES CORPORATION, Armonk, NY (US)

(72) Inventors: Ruilong Xie, Niskayuna, NY (US); Julien Frougier, Albany, NY (US); Nicolas Loubet, Guilderland, NY (US); Lawrence A. Clevenger, Saratoga Springs, NY (US); Prasad Bhosale, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 685 days.

(21) Appl. No.: 17/551,402

(22) Filed: Dec. 15, 2021

(65) Prior Publication Data

US 2023/0187531 A1 Jun. 15, 2023

(51) Int. Cl.

| | |
|---|---|
| ***H10D 64/01*** | (2025.01) |
| ***H10D 30/01*** | (2025.01) |
| ***H10D 30/67*** | (2025.01) |
| ***H10D 62/10*** | (2025.01) |
| ***H10P 14/20*** | (2026.01) |

(52) U.S. Cl.

CPC ......... *H10D 64/017* (2025.01); *H10D 30/031* (2025.01); *H10D 30/6735* (2025.01); *H10D 30/6757* (2025.01); *H10D 62/118* (2025.01); *H10D 64/018* (2025.01); *H10P 14/3452* (2026.01)

(58) Field of Classification Search

None

See application file for complete search history.

(56) References Cited

U.S. PATENT DOCUMENTS

| | | | |
|---|---|---|---|
| 9,818,650 | B2 | 11/2017 | Doris et al. |
| 10,153,280 | B2 | 12/2018 | Chiang et al. |
| 10,249,738 | B2 | 4/2019 | Bergendahl et al. |
| 10,410,927 | B1 | 9/2019 | Cheng |
| 10,410,933 | B2 | 9/2019 | Xie et al. |
| 10,411,010 | B2 | 9/2019 | Xie et al. |

(Continued)

FOREIGN PATENT DOCUMENTS

| | | |
|---|---|---|
| JP | 2015-041771 A | 3/2015 |
| JP | 2015-522948 A | 8/2015 |
| JP | 2018-073971 A | 5/2018 |

OTHER PUBLICATIONS

Japan Patent Office, "Notice of Reasons for Refusal" Apr. 21, 2026, 08 Pages, JP Application No. 2024-534773.

*Primary Examiner* — Alexander G Ghyka

(74) *Attorney, Agent, or Firm* — Harrity & Harrity, LLP

(57) ABSTRACT

A semiconductor device includes a first gate stack disposed over an active region and a second gate stack disposed over a shallow trench isolation (STI) region such that the first gate stack is taller than the second gate stack. The second gate stack includes a plurality of gates formed over a non-active region. The nanosheet stacks in the active region include first inner spacers and second inner spacers. The first inner spacers are vertically aligned with the second inner spacers. Further, the first inner spacers directly contact lower side-walls of a source/drain epitaxial region to isolate the second gate stack from the STI region.

13 Claims, 13 Drawing Sheets

(56) References Cited

U.S. PATENT DOCUMENTS

| | | | |
|---|---|---|---|
| 10,431,651 | B1 | 10/2019 | Chao et al. |
| 10,510,580 | B2 | 12/2019 | Lin et al. |
| 10,707,083 | B2 | 7/2020 | Cheng et al. |
| 10,832,916 | B1 | 11/2020 | Xie et al. |
| 10,833,076 | B2 | 11/2020 | Mistkawi et al. |
| 11,056,394 | B2 | 7/2021 | Liaw |
| 2007/0241386 | A1 | 10/2007 | Wang et al. |
| 2008/0102612 | A1 | 5/2008 | Dyer et al. |
| 2013/0234253 | A1* | 9/2013 | Toh ........................ H10D 84/83 257/368 |
| 2016/0379886 | A1* | 12/2016 | Kim ..................... H10D 64/015 438/283 |
| 2019/0341450 | A1 | 11/2019 | Lee et al. |
| 2019/0341500 | A1 | 11/2019 | Leobandung |
| 2019/0378915 | A1 | 12/2019 | Frougier et al. |
| 2021/0167209 | A1 | 6/2021 | Liao et al. |
| 2021/0183855 | A1 | 6/2021 | Ng et al. |

* cited by examiner 32
30
26
12
Tsus
10
Y
30
12
30
12
32
26
22
24
10
X
12
30

FORMING NS GATES WITH IMPROVED MECHANICAL STABILITY

BACKGROUND

The present invention relates generally to semiconductor devices, and more specifically, to forming nanosheet (NS) gates in semiconductor structures with improved mechanical stability.

In active nanosheet regions, dummy gates wrap around fins or nanosheets. Unlike gates in active fin or nanosheet region which are actually used electrically to control the transistor, dummy gates in an isolation region (e.g., shallow trench isolation (STI) region) have no electrical function but are needed for patterning purposes. Therefore, nanosheets serve as mechanical anchors to hold gates stable in active regions. However, in STI regions, dummy gates sit directly on the STI oxide. The aspect ratio of the dummy gates is usually greater than 10:1. It has been found that the instability of the high aspect ratio dummy gates on STI collapse and can potentially cause defects and yield issues.

Therefore, there is a need to reduce waste in transistor fabrication by producing transistors with a short gate length without a gate collapsing issue.

SUMMARY

In accordance with an embodiment, a semiconductor device is provided. The semiconductor device includes a first gate stack disposed over an active region and a second gate stack disposed over a shallow trench isolation (STI) region, wherein the first gate stack is taller than the second gate stack.

In accordance with another embodiment, a semiconductor device is provided. The semiconductor device includes a nanosheet structure disposed over a substrate and having a first gate stack including a plurality of dummy gates and a second gate stack disposed over a shallow trench isolation (STI) region, wherein the first gate stack is taller than the second gate stack.

In accordance with yet another embodiment, a method device is provided. The method includes forming a nanosheet (NS) stack over a substrate, and shallow trench isolation (STI) regions within the substrate, depositing a dummy gate liner over the NS stack and the STI regions, depositing a first dielectric material adjacent the dummy gate liner, depositing a second dielectric material over the first dielectric material and the dummy gate liner, performing gate patterning by selectivity etching the dummy gate liner and the NS stack, indenting the dummy gate liner to form first inner spacers, indenting alternating sacrificial layers of the NS stack to form second inner spacers, removing the second dielectric material, the dummy gate liner, and the indented alternating sacrificial layers of the NS stack, and forming replacement metal gate and gate cuts.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
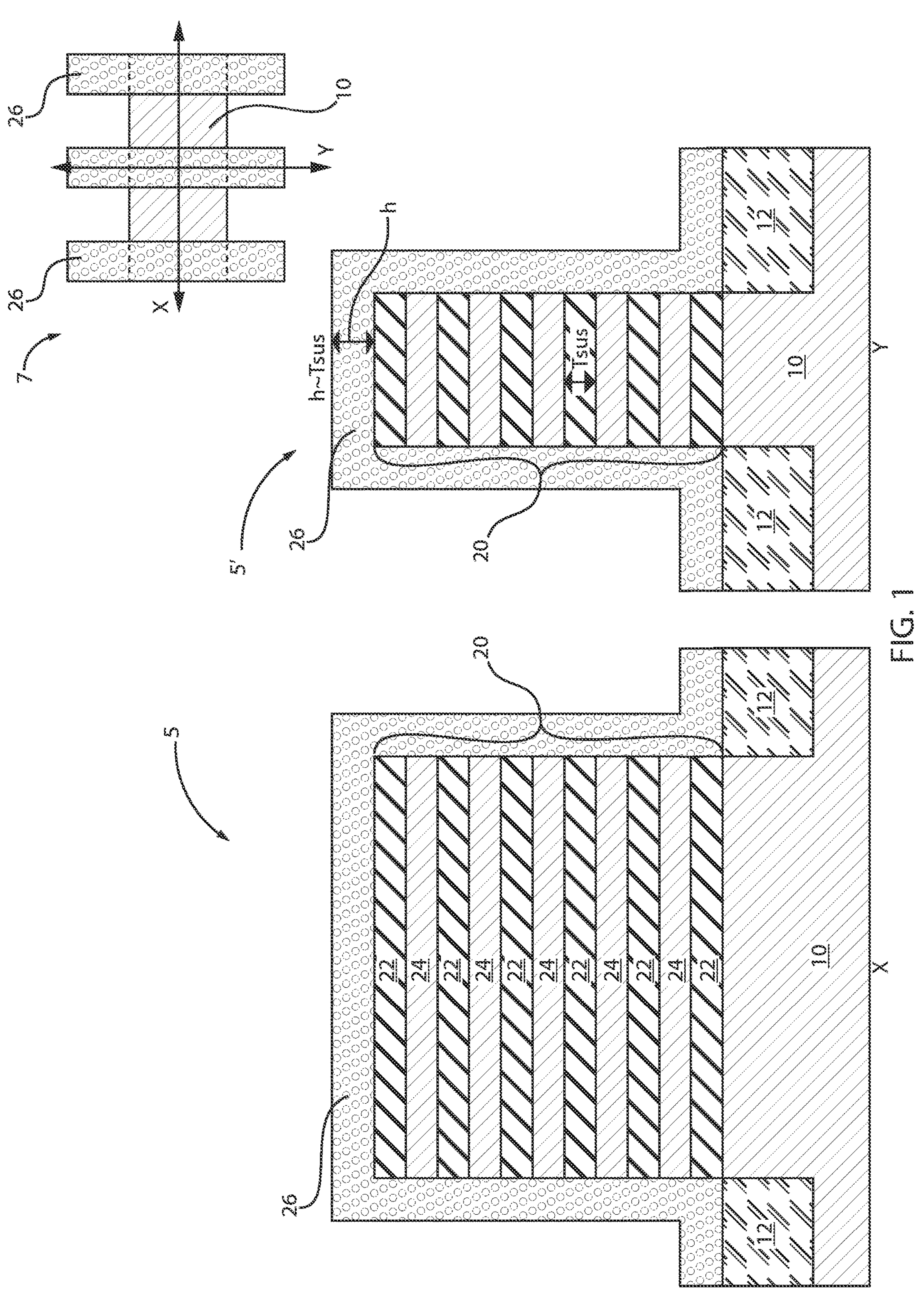
FIG. 1 is a cross-sectional view of a semiconductor structure including a nanosheet stack formed over a substrate, as well as a sacrificial gate liner formed over the nanosheet stack, in accordance with an embodiment of the present invention.

Embodiments in accordance with the present invention provide methods and devices for forming gates in semiconductor structures with improved mechanical stability.

FinFETs were the answer to device scaling limitations imposed by shrinking gate lengths and required electrostatics. The introduction of FinFETs began at the 22 nm node and has continued through the 7 nm node. Beyond 7 nm, it appears that nanosheet device structures will be used for at least the 5 nm and probably the 3 nm nodes. The nanosheet device structure turns the FinFET structure on its side and then stacks a few of these nanosheets one on top of the another. This increases the effective device width per active footprint area, and ultimately the available drive current. Optimizing nanosheet performance requires careful design of the nanosheet width ($D_{wire}$), the nanosheet thickness ($T_{wire}$), and the nanosheet spacing ($T_{sus}$). With careful optimization of geometry, nanosheets outperform FinFETs both electrostatically and with respect to $I_{on}/I_{off}$ performance. Even with potentially higher total effective capacitance, the nanosheet AC frequency performance also improves upon its FinFET predecessor.

As semiconductor technology scales to 3 nm and beyond, back end of line (BEOL) interconnect technology must also scale to take advantage of the power-performance improvements created by these new device structures. The BEOL interconnects need to provide low wire and via resistance, in order to ensure power efficiency and meet reliability requirements at the smaller line widths. The dual damascene interconnect process has been the BEOL workhorse for multiple technology generations up to the present time, but may have future scaling issues. Until recently, copper (Cu) has been the metal of choice for interconnects, but as devices continue to scale towards smaller and smaller metal pitches it is being challenged from both a resistance and reliability point of view. Copper liner requirements limit the ability to scale this metal to smaller dimensions. This limitation has increased research into replacing copper with alternative metals such as Co, Ru, and Mo at the local metal levels. Hybrid metallization or via prefill are other technology options being explored to scale BEOL interconnects.

Moreover, another challenging issue for nanosheet devices is the gate structure, and, in particular, gate collapse issues and increased parasitic capacitance. Taller gate heights due to taller fins heights can cause a gate to collapse (or gate bending) and can increase parasitic capacitance. The exemplary embodiments of the present invention present methods and structures for forming dummy gates of "fatter" or thicker sizes and supporting structures to make the gates more mechanically stable.

Examples of semiconductor materials that can be used in forming such nanosheet structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a nanosheet stack formed over a substrate, as well as a sacrificial gate liner formed over the nanosheet stack, in accordance with an embodiment of the present invention.

In various example embodiments, a semiconductor structure 5 includes shallow trench isolation (STI) regions 12 formed within a substrate 10. In one example, a field effect transistor (FET) device can be formed over the substrate 10. The FET device can be formed by constructing a nanosheet stack.

The nanosheet stack 20 of the structure 5 can include alternating layers of a first semiconductor layer 22 and a second semiconductor layer 24. The first semiconductor layer 22 can be, e.g., silicon germanium (SiGe) and the second semiconductor layer 24 can be, e.g., silicon (Si). The nanosheet stack 20 can also be referred to as a nanosheet structure.

A sacrificial gate liner 26 is deposited over the nanosheet stack 20. The sacrificial gate liner 26 can also be referred to as a dummy gate liner.

Structure 5 is a cross-sectional view along the axis X.

Structure 5' is a cross-sectional view along the axis Y. Structure 5' further illustrates a thickness of the first semiconductor layer 22 designated as $T_{sus}$ and a thickness of the sacrificial gate liner 26 designated as "h." In one example embodiment, $h \sim T_{sus}$.

Structure 7 is a top view of the structure 5, 5'. Structure 7 illustrates the sacrificial gate liner 26 formed over the nanosheet stack 20.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

The shallow trench isolation (STI) regions 12 can be formed by etching a trench in the substrate 10 between adjacent active nanosheets utilizing a conventional dry etching process such as reactive ion etching (RIE) or plasma etching. The trenches can optionally be lined with a conventional liner material, e.g., silicon nitride or silicon oxynitride, and then chemical vapor deposition (CVD) or another like deposition process is used to fill the trench with silicon oxide or another like STI dielectric material. The STI dielectric can optionally be densified after deposition. A conventional planarization process such as chemical-mechanical polishing (CMP) can optionally be used to provide a planar structure, followed by a STI dielectric recess such that nanosheet stacks are revealed for further processing.

Referring to, e.g., the nanosheet stack 20, the first semiconductor layer 22 can be the first layer in a stack of sheets of alternating materials. The nanosheet stack 20 includes the first semiconductor layers 22 and the second semiconductor layers 24. Although it is specifically contemplated that the first semiconductor layers 22 can be formed from silicon germanium and that the second semiconductor layers 24 can be formed from silicon, it should be understood that any appropriate materials can be used instead, as long as the two semiconductor materials have etch selectivity with respect to one another. As used herein, the term "selective" in reference to a material removal process denotes that the rate of material removal for a first material is greater than the rate of removal for at least another material of the structure to which the material removal process is being applied. The alternating semiconductor layers 22/24 can be deposited by any appropriate mechanism. It is specifically contemplated that the semiconductor layers 22/24 can be epitaxially grown from one another, but alternate deposition processes, such as chemical vapor deposition (CVD), physical vapor deposition (PVD), atomic layer deposition (ALD), or gas cluster ion beam (GCIB) deposition, are also contemplated.

The sacrificial gate liner 26 can be, e.g., AlOx, $SiO_2$, TiOx, TiN, etc.

Figure 2:
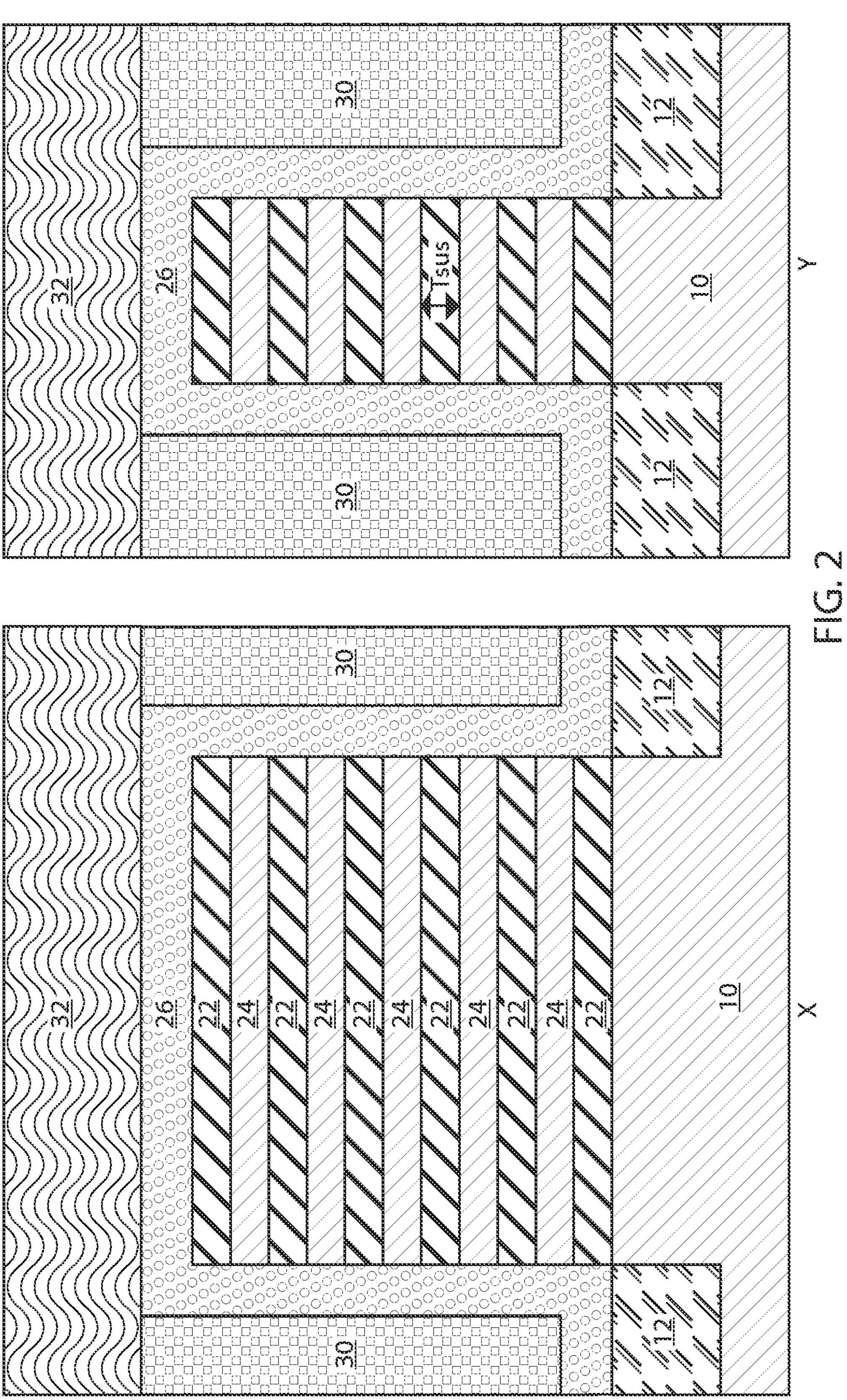
FIG. 2 is a cross-sectional view of the semiconductor structure of FIG. 1 where a first dielectric is formed adjacent the nanosheet stack and a second dielectric is formed over the nanosheet stack, in accordance with an embodiment of the present invention.

FIG. 2 is a cross-sectional view of the semiconductor structure of FIG. 1 where a first dielectric is formed adjacent the nanosheet stack and a second dielectric is formed over the nanosheet stack, in accordance with an embodiment of the present invention.

A first dielectric 30 is deposited over the nanosheet stack 20. The first dielectric 30 is then planarized by, e.g., chemical-mechanical polishing (CMP) such that the first dielectric 30 is formed adjacent the nanosheet stack 20 in direct contact with sidewalls of the sacrificial gate liner 26. Subsequently, a second dielectric 32 is deposited over the nanosheet stack 20 and in direct contact with a top surface of the sacrificial gate liner 26. The second dielectric 32 directly contacts a top surface of the first dielectric 30.

The first and second dielectrics 30, 32 can include, but are not limited to, SiN, SiOCN, SiOC, SiBCN, $SO_2$, or ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 10.

In some embodiments, the first and second dielectrics 30, 32 can be conformally deposited using atomic layer deposition (ALD) or, chemical vapor deposition (CVD). Variations of CVD processes suitable for forming the first and second dielectrics 30, 32 include, but are not limited to, Atmospheric Pressure CVD (APCVD), Low Pressure CVD (LPCVD) and Plasma Enhanced CVD (PECVD), Metal-Organic CVD (MOCVD) and combinations thereof can also be employed.

Figure 3:
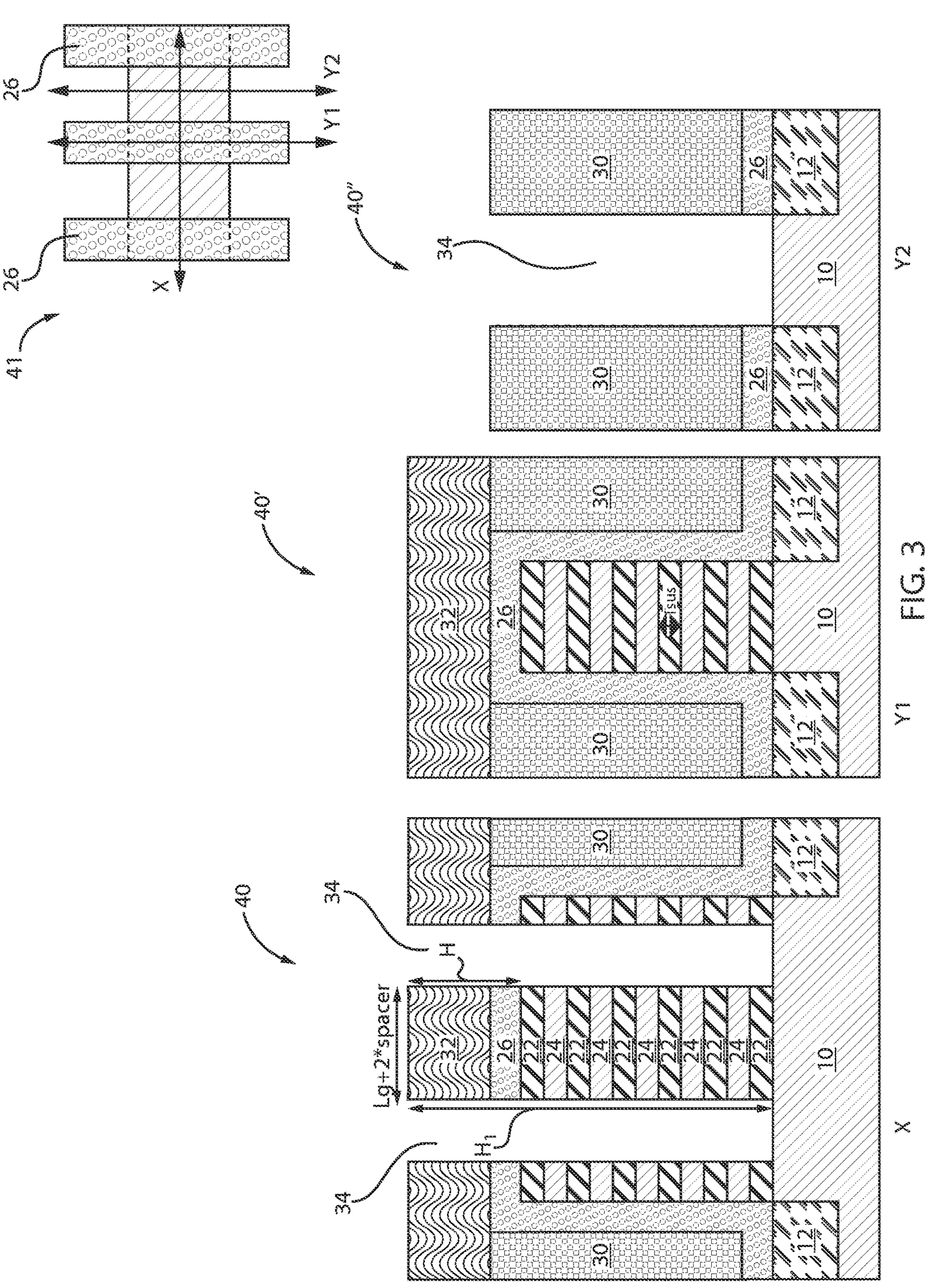
FIG. 3 is a cross-sectional view of the semiconductor structure of FIG. 2 where gate patterning is performed, in accordance with an embodiment of the present invention.

FIG. 3 is a cross-sectional view of the semiconductor structure of FIG. 2 where gate patterning is performed, in accordance with an embodiment of the present invention.

Openings 34 are formed extending through the second dielectric 32 and through the nanosheet stack 20 such that a top surface of the substrate 10 is exposed.

In structure 40, in the X cut, a combined height of the sacrificial gate liner 26 and the second dielectric 32 is designated as H. In one example, H can be about 35 nm. A combined height of the nanosheet stack 20, the sacrificial gate liner 26, and the second dielectric 32 is designated as $H_1$. In one example, $H_1<200$ nm. A width of the nanosheet stack 20 can be, e.g., Lg+2*spacer, where Lg is the gate length and "spacer" stands for gate spacer or inner spacer, which will be formed later. In one example, this width is about 30 nm.

In structure 40', in the Y1 cut, the openings 34 are not visible.

In structure 40", in the Y2 cut, the opening 34 is visible and extends to a top surface of the substrate 10. The etch process which etches the opening 34 does not etch the first dielectric 30. The remaining first dielectric 30 in the Y2 cut helps stabilize the gates to prevent gate collapse or gate bending.

Top view 41 illustrates the direction of the X cut, the Y1 cut, and the Y2 cut.

Any etching technique known in the art can be used for the recessing.

Figure 4:
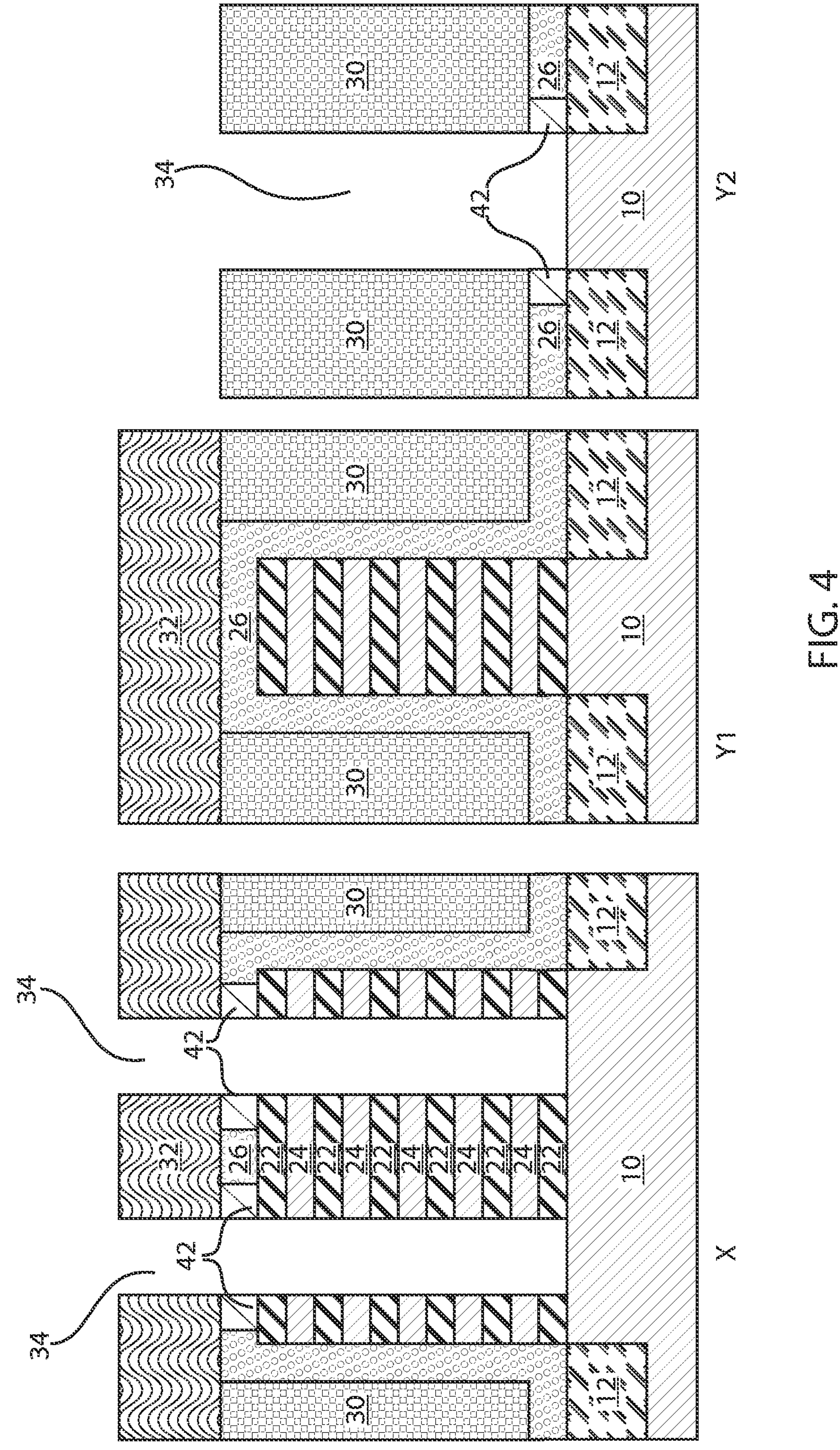
FIG. 4 is a cross-sectional view of the semiconductor structure of FIG. 3 where first inner spacers are formed adjacent the sacrificial gate liner and over the nanosheet stack, in accordance with an embodiment of the present invention.

FIG. 4 is a cross-sectional view of the semiconductor structure of FIG. 3 where first inner spacers are formed adjacent the sacrificial gate liner and over the nanosheet stack, in accordance with an embodiment of the present invention.

The sacrificial gate liner 26 is selectively etched to create indents filled with first inner spacers 42. The first inner spacers 42 are visible in the X cut and the Y2 cut. The first inner spacers 42 directly contact sidewalls of the sacrificial gate liner 26. In the X cut, the first inner spacers 42 directly contact a top surface of the nanosheet stack 20.

The first inner spacers 42 can include any of one or more of SiN, SiBN, SiCN, SiC, and/or SiBCN films.

Figure 5:
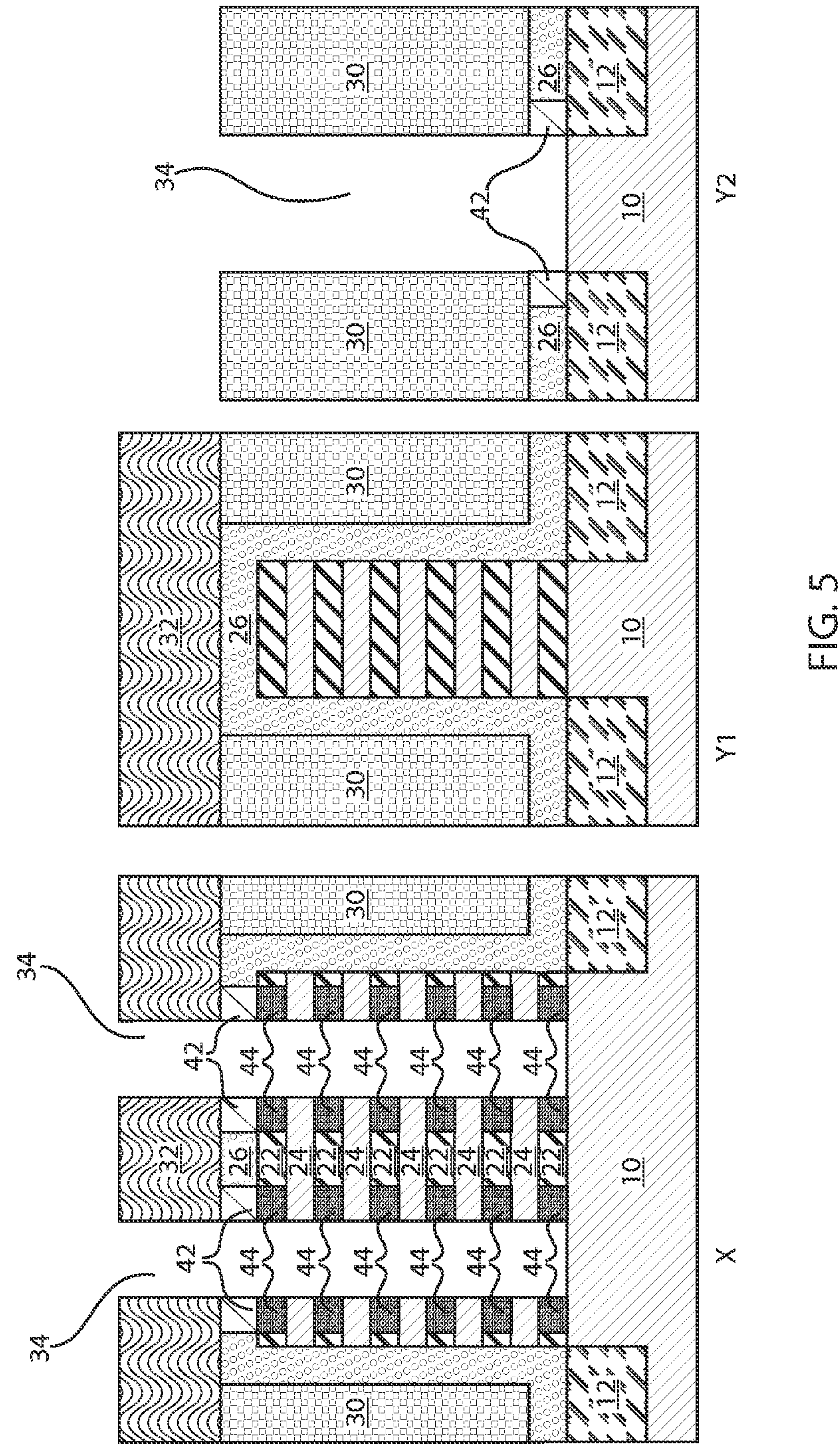
FIG. 5 is a cross-sectional view of the semiconductor structure of FIG. 4 where alternating sacrificial layers of the nanosheet stack are indented to form second inner spacers, in accordance with an embodiment of the present invention.

FIG. 5 is a cross-sectional view of the semiconductor structure of FIG. 4 where alternating sacrificial layers of the nanosheet stack are indented to form second inner spacers, in accordance with an embodiment of the present invention.

Alternating sacrificial layers 22 of the nanosheet stack 20 are indented to form second inner spacers 44. The second inner spacers 44 are vertically aligned with the first inner spacers 42. In the X cut, at least one of the second spacers 44 directly contacts a first spacer 42.

The second inner spacers 44 can include any of one or more of SiN, SiBN, SiCN, SiC, and/or SiBCN films.

The etching can include a selective dry or wet etch process.

In some examples, the selective wet etch or the selective dry etch can selectively remove the portions of first semiconductor layer 22 (e.g., the SiGe layer) and leave the entirety or portions of the second semiconductor layer 24. The removal creates gaps or openings or indentations between the second semiconductor layers 24 of the FET devices.

The dry and wet etching processes can have etching parameters that can be tuned, such as etchants used, etching temperature, etching solution concentration, etching pressure, source power, RF bias voltage, RF bias power, etchant flow rate, and other suitable parameters. Dry etching processes can include a biased plasma etching process that uses a chlorine-based chemistry. Other dry etchant gasses can include Tetrafluoromethane ($CF_4$), nitrogen trifluoride ($NF_3$), sulfur hexafluoride ($SF_6$), and helium (He), and Chlorine trifluoride ($ClF_3$). Dry etching can also be performed anisotropically using such mechanisms as DRIE (deep reactive-ion etching). Chemical vapor etching can be used as a selective etching method, and the etching gas can include hydrogen chloride (HCl), Tetrafluoromethane ($CF_4$), and gas mixture with hydrogen ($H_2$). Chemical vapor etching can be performed by CVD with suitable pressure and temperature.

Figure 6:
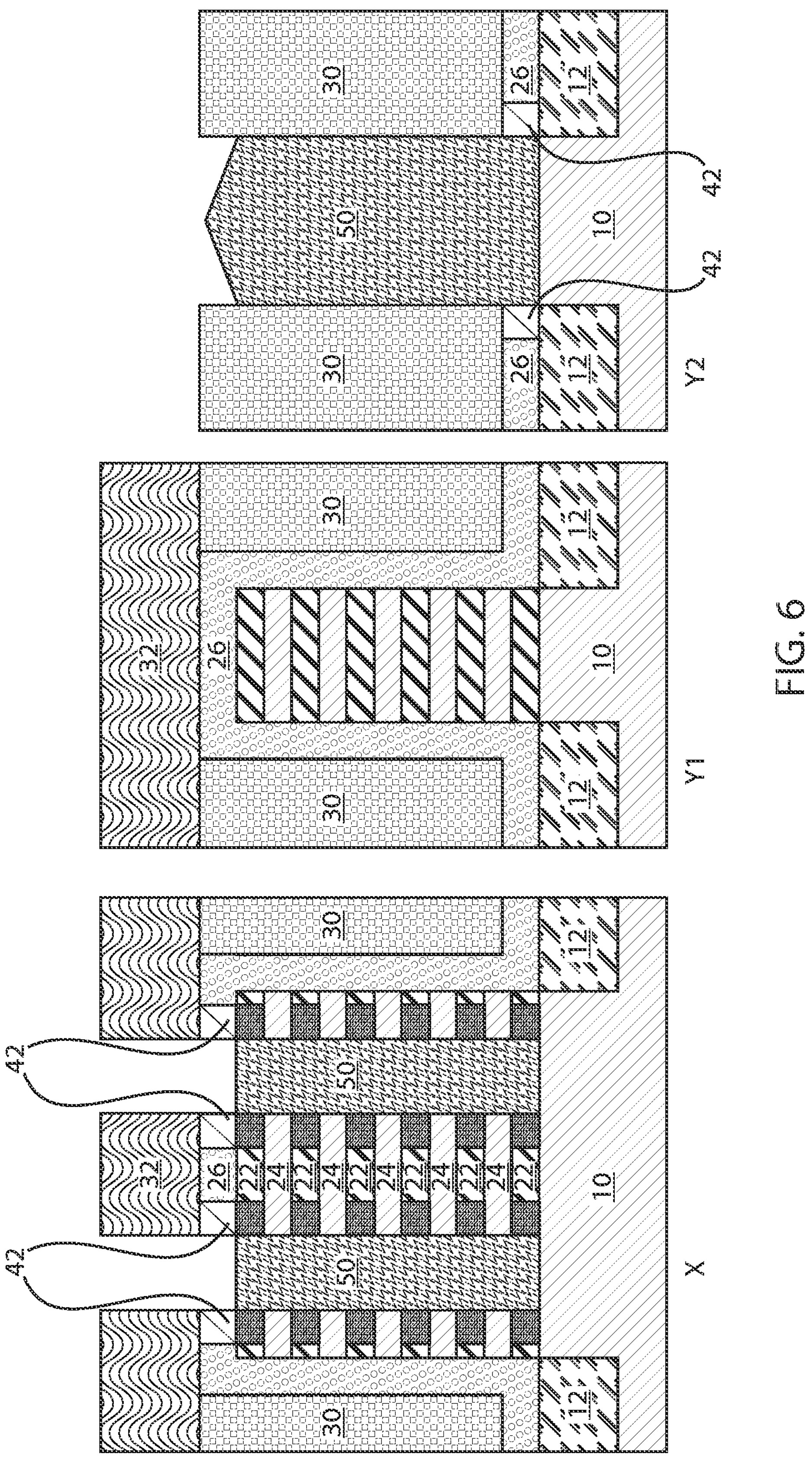
FIG. 6 is a cross-sectional view of the semiconductor structure of FIG. 5 where source/drain epitaxial regions are formed, in accordance with an embodiment of the present invention.

FIG. 6 is a cross-sectional view of the semiconductor structure of FIG. 5 where source/drain epitaxial regions are formed, in accordance with an embodiment of the present invention.

Source/drain epitaxial regions 50 are formed.

In the X cut, the source/drain epitaxial regions 50 are formed between the nanosheet stacks 20. In the Y2 cut, the source/drain epitaxial region 50 is formed between the first dielectric 30. The source/drain epitaxial regions 50 directly contact a top surface of the substrate 10.

In the X cut, the source/drain epitaxial regions 50 directly contact sidewalls of the second inner spacers 44, as well as the sidewalls of the alternating second semiconductor layers 24 (e.g., Si layers) of the nanosheet stack 20. The source/drain epitaxial regions 50 extend to a bottom surface of the first inner spacers 42.

In the Y2 cut, the source/drain epitaxial region 50 directly contacts sidewalls of the first inner spacers 42. The source/drain epitaxial region 50 directly contacts sidewalls of the first dielectric 30.

Therefore, the first inner spacers 42 and the second inner spacers 44 directly contact sidewalls of the source/drain epitaxial region 50. The first inner spacers 42 directly contact lower sidewalls of the source/drain epitaxial region 50 to isolate the second gate stack from the STI region 12 (cut Y2).

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 7:
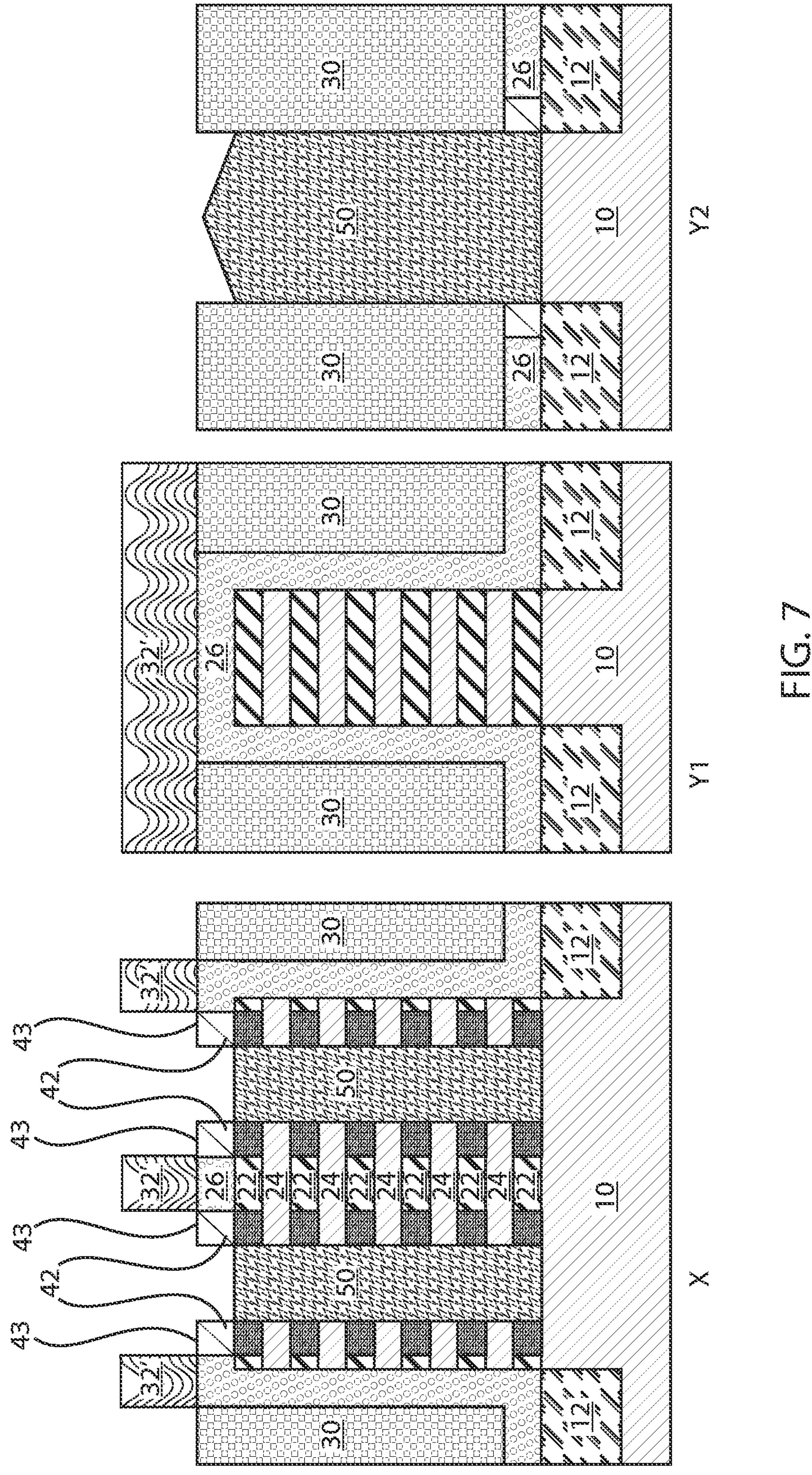
FIG. 7 is a cross-sectional view of the semiconductor structure of FIG. 6 where the second dielectric is selectively trimmed to expose a top surface of the first inner spacers, in accordance with an embodiment of the present invention.

FIG. 7 is a cross-sectional view of the semiconductor structure of FIG. 6 where the second dielectric is selectively trimmed to expose a top surface of the first inner spacers, in accordance with an embodiment of the present invention.

The second dielectric 32 is selectively trimmed to expose a top surface 43 of the first inner spacers 42. The remaining second dielectric is designated as 32'. The second dielectric 32 can be selectively trimmed by any known etching technique.

Figure 8:
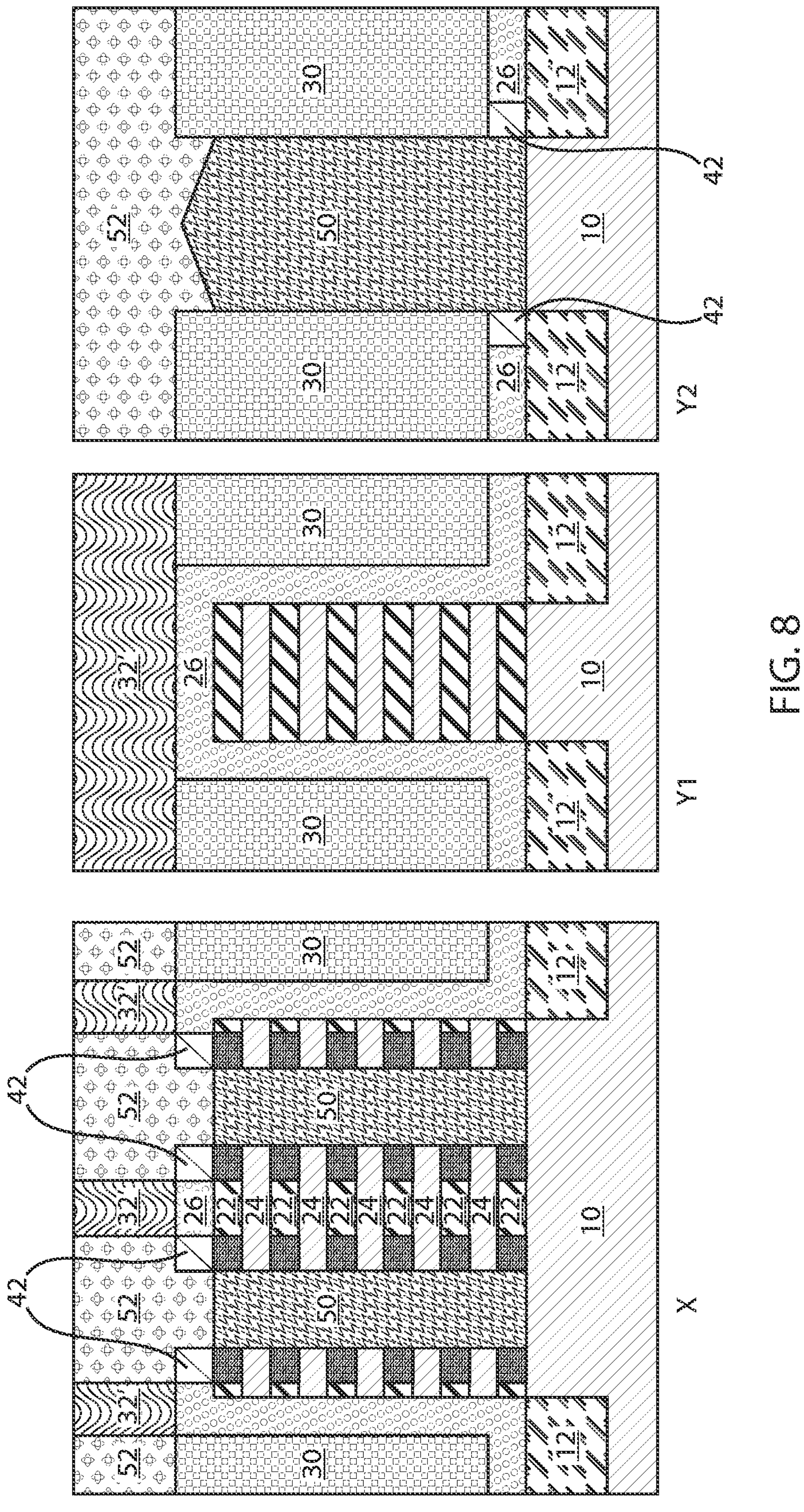
FIG. 8 is a cross-sectional view of the semiconductor structure of FIG. 7 where an interlayer dielectric (ILD) is deposited and planarized, in accordance with an embodiment of the present invention.

FIG. 8 is a cross-sectional view of the semiconductor structure of FIG. 7 where an interlayer dielectric (ILD) is deposited and planarized, in accordance with an embodiment of the present invention.

An ILD 52 is formed over and in direct contact with the source/drain epitaxial regions 50. The ILD 52 also directly contacts top surfaces of the first dielectric 30.

The ILD 52 can be any suitable material, such as, for example, porous silicates, carbon doped oxides, silicon dioxides, silicon nitrides, silicon oxynitrides, or other dielectric materials. Any known manner of forming the ILD 52 can be utilized. The ILD 52 can be formed using, for example, CVD, PECVD, ALD, flowable CVD, spin-on dielectrics, or PVD.

Figure 9:
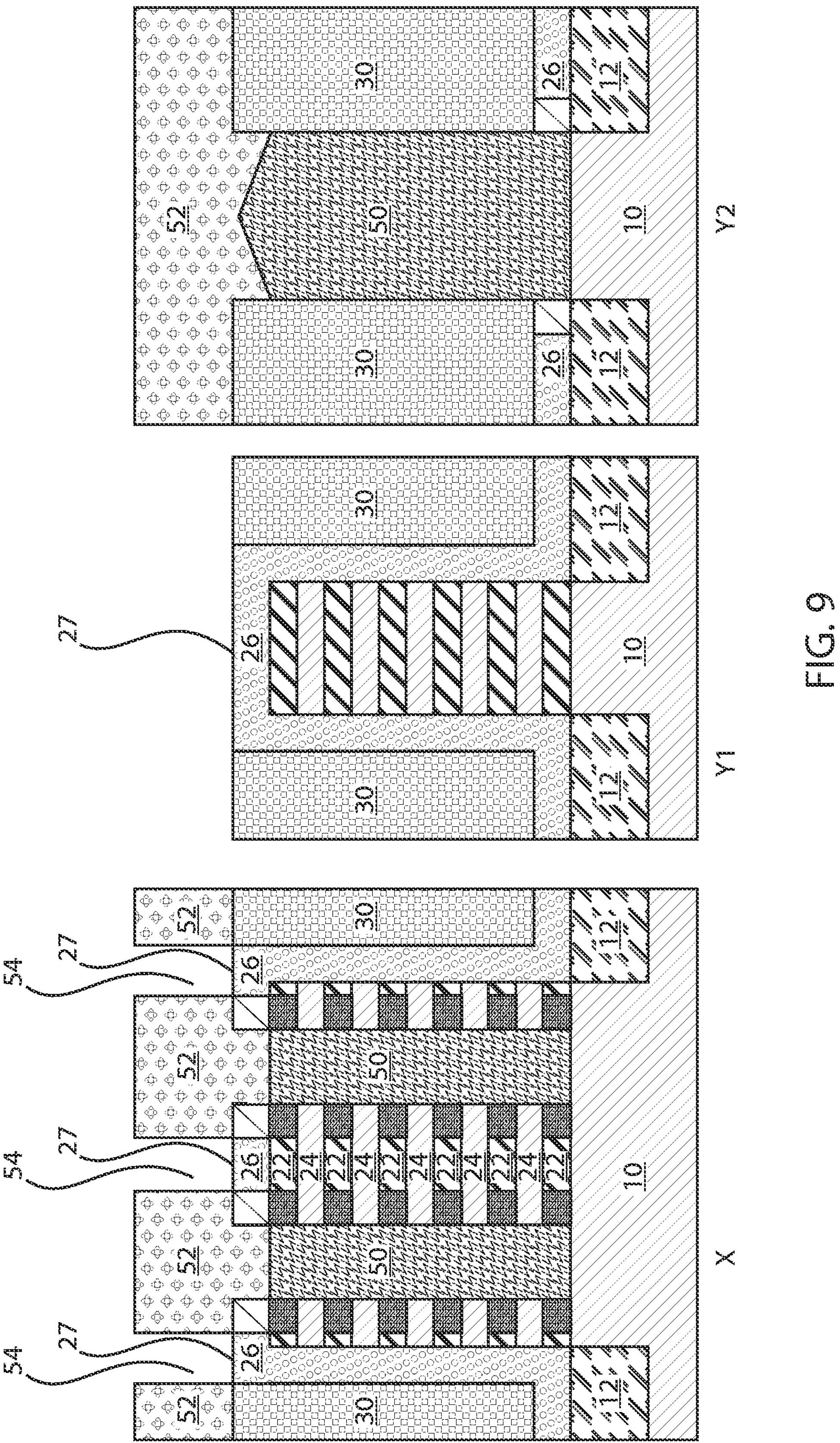
FIG. 9 is a cross-sectional view of the semiconductor structure of FIG. 8 where the trimmed second dielectric is selectively removed to expose a top surface of the sacrificial gate liner, in accordance with an embodiment of the present invention.

FIG. 9 is a cross-sectional view of the semiconductor structure of FIG. 8 where the trimmed second dielectric is selectively removed to expose a top surface of the sacrificial gate liner, in accordance with an embodiment of the present invention.

The trimmed second dielectric 32' is selectively removed to expose a top surface 27 of the sacrificial gate liner 26. Openings 54 are defined between the ILD 52, in the X cut.

Figure 10:
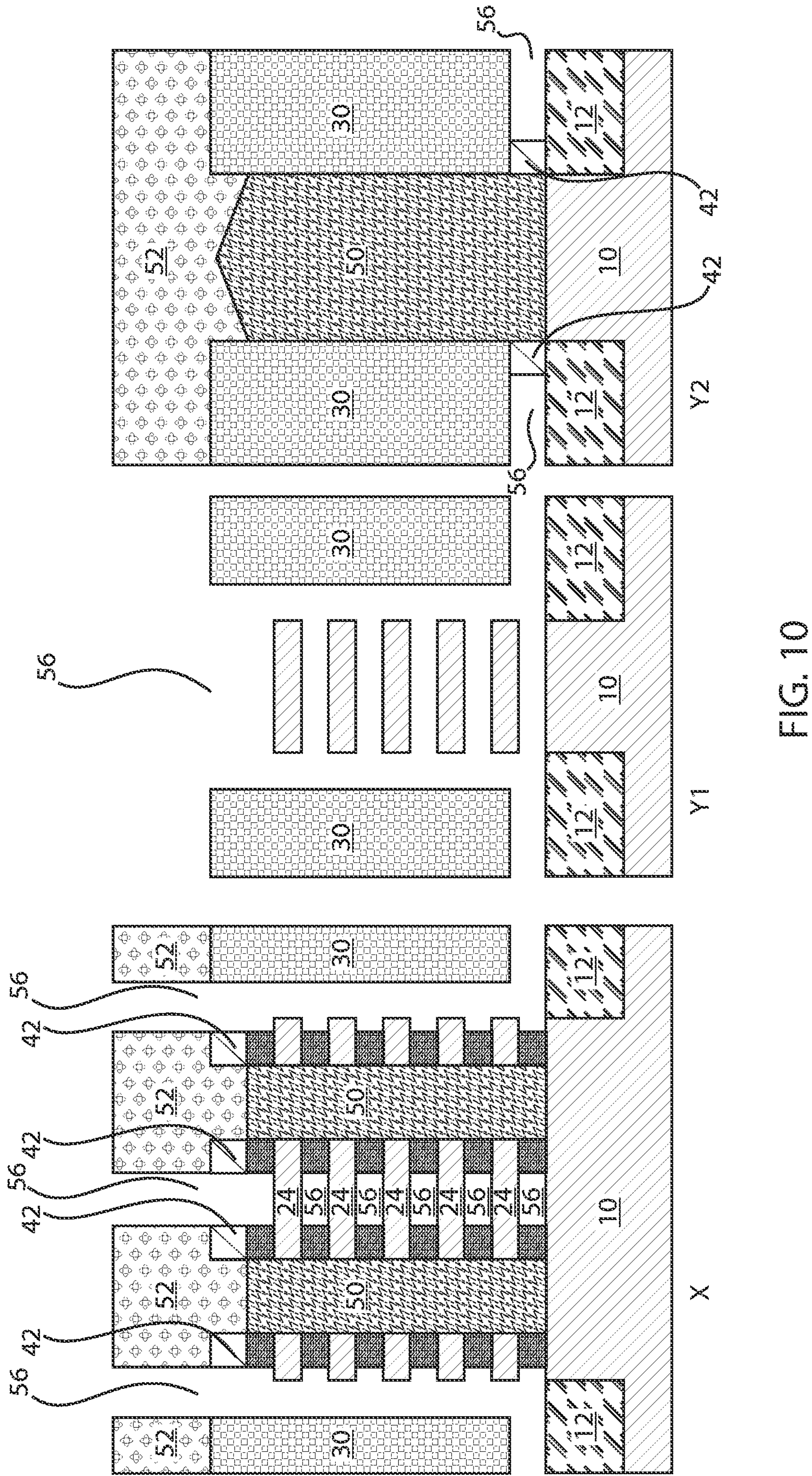
FIG. 10 is a cross-sectional view of the semiconductor structure of FIG. 9 where the sacrificial gate liner and the indented alternating sacrificial layers of the nanosheet stack are selectively removed, in accordance with an embodiment of the present invention.

FIG. 10 is a cross-sectional view of the semiconductor structure of FIG. 9 where the sacrificial gate liner and the indented alternating sacrificial layers of the nanosheet stack are selectively removed, in accordance with an embodiment of the present invention.

The sacrificial gate liner 26 and the indented alternating sacrificial second semiconductor layers 22 of the nanosheet stack 20 are selectively removed thus creating openings or gaps 56. The gaps 56 expose sidewalls of the first inner spacers 42 and the second inner spacers 44.

Figure 11:
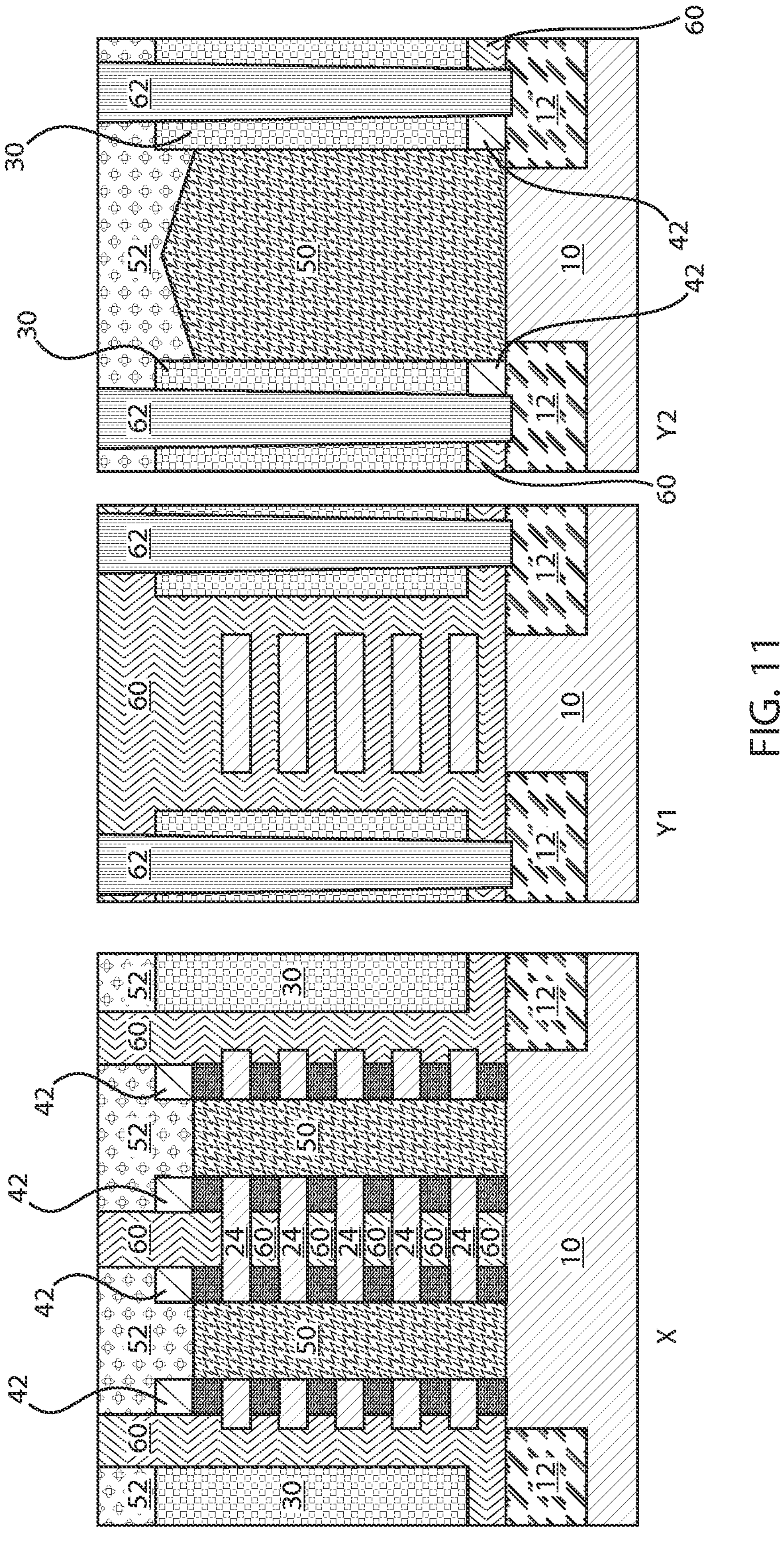
FIG. 11 is a cross-sectional view of the semiconductor structure of FIG. 10 where replacement high-k metal gate formation takes place with gate cut, in accordance with an embodiment of the present invention.

FIG. 11 is a cross-sectional view of the semiconductor structure of FIG. 10 where replacement high-k metal gate formation takes place with gate cut, in accordance with an embodiment of the present invention.

A high-k metal gate (HKMG) 60 is deposited within the openings or gaps 56.

A gate cut 62 is also made, as shown in the Y1 and Y2 cuts. The gate cut 62 extends through the first dielectric 30. The gate cut 62 extends into the STI regions 12. The gate cut 62 is filled with dielectric such as $SiO_2$, SiN, SiBCN, SiOCN, SiOC, SiC, etc.

In various embodiments, the high-k materials can include but are not limited to work function metals such as titanium nitride, titanium carbide, titanium aluminum carbide, tantalum nitride and tantalum carbide; conducting metals such as tungsten, aluminum and copper; and oxides such as silicon dioxide ($SiO_2$), hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$).

Figure 12:
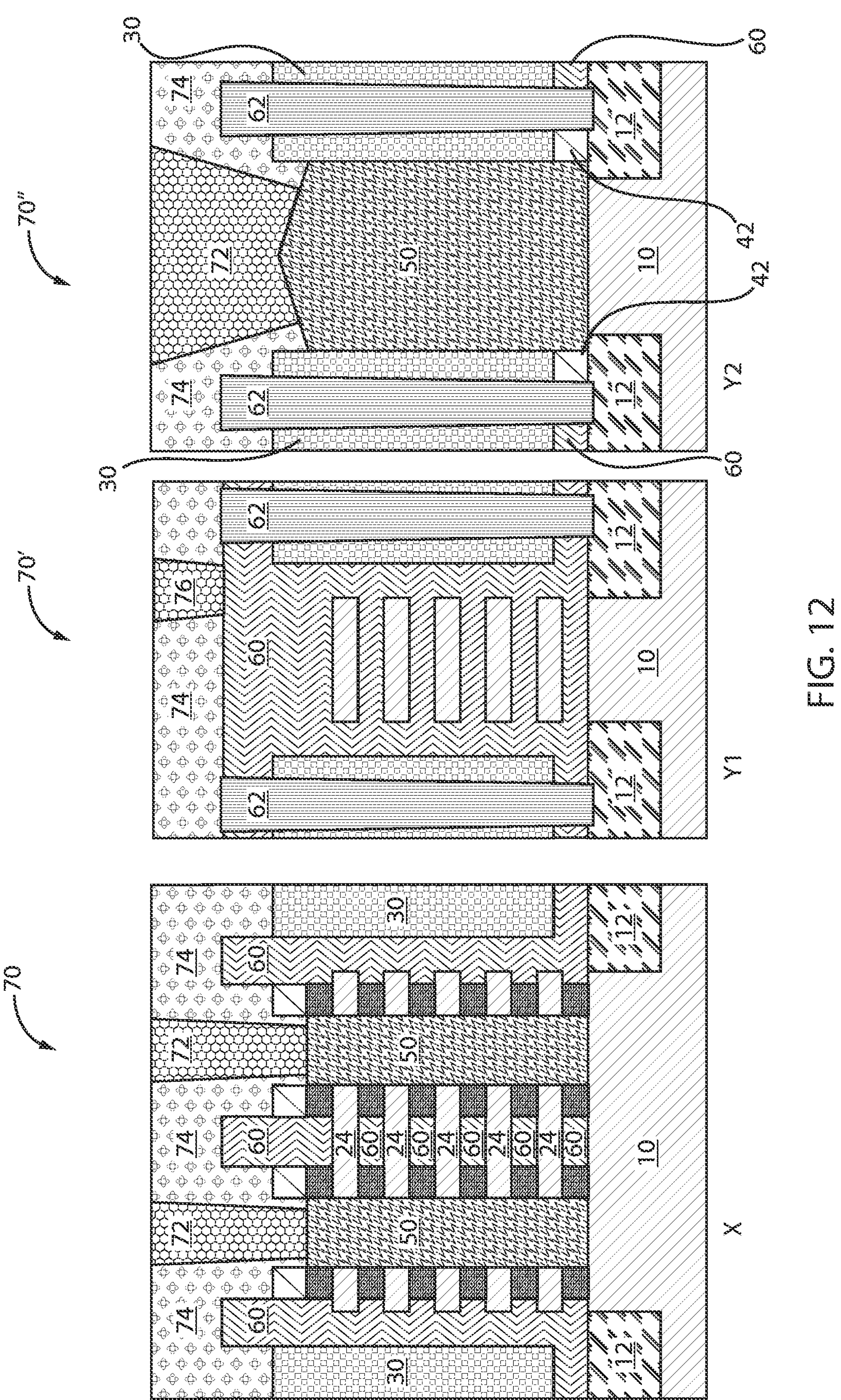
FIG. 12 is a cross-sectional view of the semiconductor structure of FIG. 11 where additional ILD is deposited, and contact formation takes place, in accordance with an embodiment of the present invention.

FIG. 12 is a cross-sectional view of the semiconductor structure of FIG. 11 where additional ILD is deposited, and contact formation takes place, in accordance with an embodiment of the present invention.

In structure 70, in the X cut, source/drain contacts 72 are formed to a top surface of the source/drain epitaxial regions 50. The source/drain contacts 72 are formed through an ILD 74.

In structure 70', in the Y1 cut, a gate contact 76 is formed to a top surface of the HKMG 60. The gate contact 76 is formed through an ILD 74.

In structure 70", in the Y2 cut, the source/drain contact 72 extends through the ILD 74 and directly contacts a top surface of the source/drain epitaxial region 50.

The additional ILD is deposited over the existing ILD 52, and here the ILD 74 is referred to as a combined ILD layer including previous ILD 52 and new ILD deposited before contact formation.

The source/drain contacts 72 and the gate contact 76 can include metals such as a silicide liner, such as Ti, Ni, NiPt, etc., a thin metal adhesion layer, such as TiN, or TaN, and high conductive metal, such as Co, W, Ru, etc.

In various exemplary embodiments, the overburden of the metals for the source/drain contacts 72 and the gate contact 76 can be removed by a CMP process.

The ILD 74 can be any suitable dielectric such as, for example, silicon oxide (SiO), silicon nitride (SiN), silicon oxynitride, silicon boron carbon nitride (SiBCN), silicon oxygen carbon nitride (SiOCN), silicon oxygen carbon (SiOC), silicon carbon nitride (SiCN), hydrogenated oxidized silicon carbon (SiCOH), low-k dielectric (k value<3.9) or any suitable combination of those materials. In one example, the ILD 74 is low-k dielectric.

Figure 13:
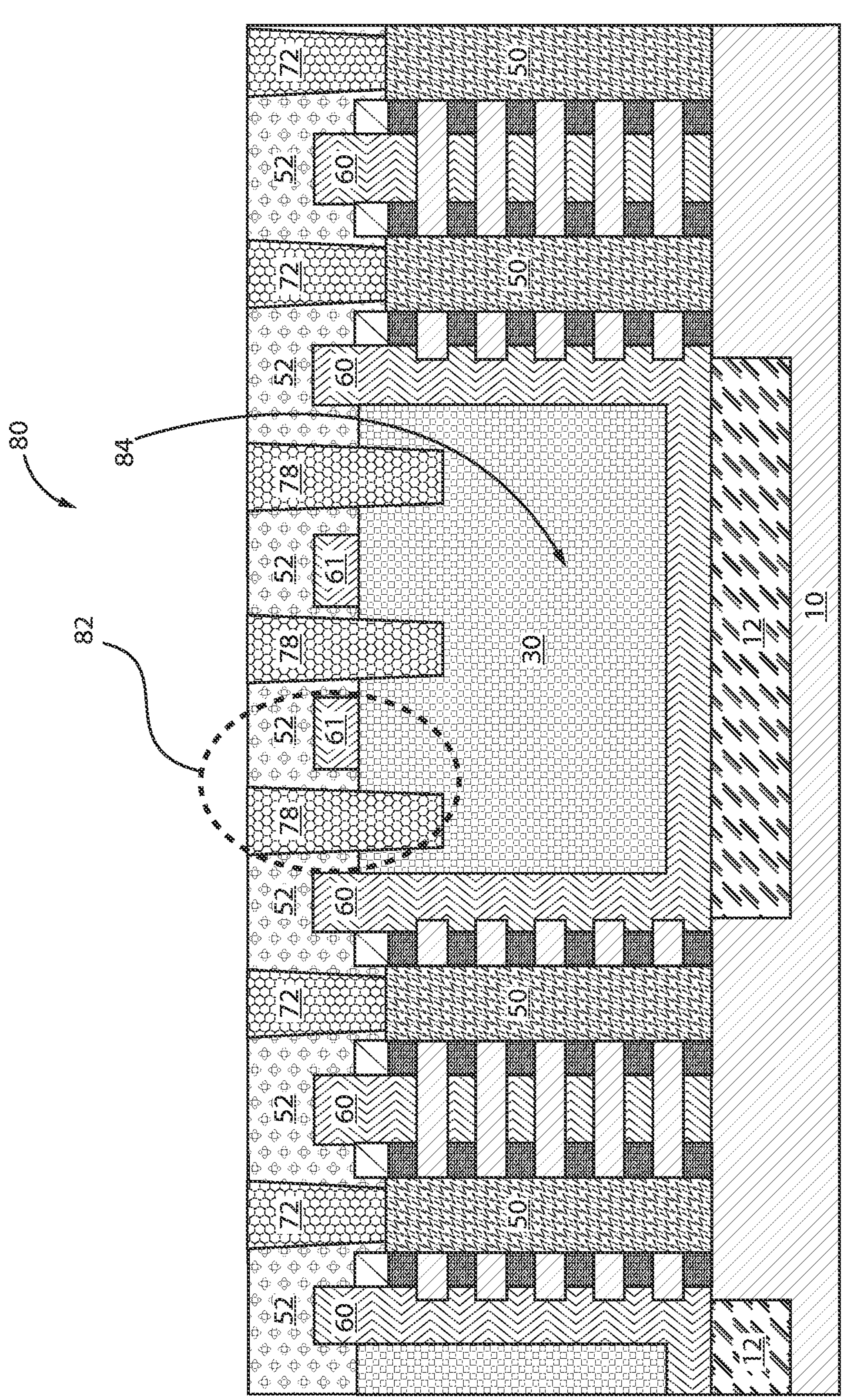
FIG. 13 is a cross-sectional view of a semiconductor structure illustrating parasitic capacitance between the source/drain contacts and the dummy gates being reduced, in accordance with an embodiment of the present invention.

FIG. 13 is a cross-sectional view of a semiconductor structure illustrating parasitic capacitance between the source/drain contacts and the dummy gates being reduced, in accordance with an embodiment of the present invention.

Structure 80 illustrates a region 82 where the parasitic capacitance between the source/drain contacts 78 and the gates 61, which are formed over the non-active region, are reduced. A region 84 illustrates short gates 61 formed over the first dielectric 30. Conventionally, gate height over the non-active region is tall, and it would form a huge parasitic capacitance between those gates and S/D contacts nearby. During the gate patterning process of the exemplary embodiments, the gate etch does not etch the first dielectric 30, thus leaving thick first dielectric over the non-active region, which decreases the metal gate height, thus reducing the parasitic capacitance between the gates 61 and the S/D contacts nearby.

Therefore, in FIG. 13, a first gate stack is disposed over an active region and a second gate stack is disposed over a non-active region over the STI 12 such that the first gate stack is taller than the second gate stack. The first gate stack extends to a top surface of the substrate 10, whereas the second gate stack extends to a top surface of the first dielectric 30. The second gate stack includes a plurality of short gates 61. The plurality of short gates 61 are disposed over the first dielectric 30. The nanosheet stacks are disposed in the active region and include the first inner spacers 42 and the second inner spacers 44. The first inner spacers 42 and the second inner spacers 44 directly contact sidewalls of the source/drain epitaxial region 50. The first inner spacers 42 directly contact lower sidewalls of the source/drain epitaxial region 50 to isolate the second gate stack from the STI region 12 (FIG. 12, cut Y2).

In conclusion, the method includes forming a nanosheet stack and STI, forming a dummy gate liner over the nanosheet stack and STI, forming a first dielectric material over the dummy gate liner, forming a second dielectric material over the first dielectric material and dummy gate liner, patterning the gate in the second dielectric and selectivity etching the dummy gate liner and the nanosheet stack, indenting the dummy gate liner and forming the first inner spacers, indenting the sacrificial SiGe and forming the second inner spacers, removing the second dielectric material, dummy gate liner and sacrificial SiGe, and forming replacement metal gate and the gate cuts. The structure includes a first gate stack over an active region and a second gate stack over the non-active region of the STI, where the first gate stack is taller than the second gate stack. Also, over the non-active region of the STI, short gates are formed over the first dielectric, which can be shared by several gates. Finally, the first inner spacers are formed over the second inner spacers, and at edges of the bottom or lower portion of the source/drain epitaxial regions, which isolate the gate from the source/drain epitaxial regions.

Regarding FIGS. 1-13, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming nanosheet (NS) gates in semiconductor structures with improved mechanical stability (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device comprising:

a first gate metal partially disposed over an active region; and a second gate metal disposed over a shallow trench isolation (STI) region, wherein the first gate metal is a longer vertical length than the second gate metal and a portion of the first gate metal is between the second gate metal and the STI region.

2. The semiconductor device of claim 1, wherein a plurality of the second gate metal are disposed over a non-active region.

3. The semiconductor device of claim 2, wherein the plurality of the second gate metal are disposed over a dielectric.

4. The semiconductor device of claim 1, wherein nanosheet stacks are disposed in the active region.

5. The semiconductor device of claim 4, wherein the nanosheet stacks include first inner spacers and second inner spacers.

6. The semiconductor device of claim 5, wherein the first inner spacers are vertically aligned with the second inner spacers.

7. The semiconductor device of claim 5, wherein the first inner spacers and the second inner spacers directly contact sidewalls of a source/drain epitaxial region.

8. The semiconductor device of claim 5, wherein the first inner spacers directly contact lower sidewalls of a source/drain epitaxial region to isolate the second gate metal from the STI region.

9. A semiconductor device comprising:

a nanosheet structure disposed over a substrate and having a first gate metal including a plurality of gates disposed over an active region; and a second gate metal disposed over a shallow trench isolation (STI) region, wherein the first gate metal is a longer vertical length than the second gate metal.

10. The semiconductor device of claim 9, wherein the nanosheet structure includes first inner spacers and second inner spacers.

11. The semiconductor device of claim 10, wherein the first inner spacers are vertically aligned with the second inner spacers.

12. The semiconductor device of claim 10, wherein the first inner spacers and the second inner spacers directly contact sidewalls of a source/drain epitaxial region.

13. The semiconductor device of claim 10, wherein the first inner spacers directly contact lower sidewalls of a source/drain epitaxial region to isolate the second gate metal from the STI region.

* * * * *